US008707894B2

(12) United States Patent
Lee et al.

(10) Patent No.: US 8,707,894 B2
(45) Date of Patent: Apr. 29, 2014

(54) MASK FRAME ASSEMBLY FOR THIN FILM DEPOSITION AND METHOD OF ASSEMBLING THE SAME

(75) Inventors: Choong-Ho Lee, Yongin (KR);
Yoon-Chan Oh, Yongin (KR);
Jung-Min Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 345 days.

(21) Appl. No.: 12/796,509

(22) Filed: Jun. 8, 2010

(65) Prior Publication Data

US 2011/0220019 A1 Sep. 15, 2011

(30) Foreign Application Priority Data

Mar. 9, 2010 (KR) ........................ 10-2010-0021010

(51) Int. Cl.
*B05C 11/00* (2006.01)
(52) U.S. Cl.
USPC .......................................................... 118/504
(58) Field of Classification Search
CPC .. C23C 14/042; C23C 14/44; H01L 51/0011; H01L 51/56; B05C 21/005
USPC .......................................................... 118/504
See application file for complete search history.

(56) References Cited

U.S. PATENT DOCUMENTS

2003/0221614 A1* 12/2003 Kang et al. .................... 118/504
2010/0192856 A1* 8/2010 Sung et al. .................... 118/504

FOREIGN PATENT DOCUMENTS

| KR | 10-2003-0075221 A | | 9/2003 |
| KR | 10-2009-0040618 | | 4/2009 |
| KR | 1020090040618 A | * | 4/2009 |
| KR | 10-2009-0059225 A | | 6/2009 |
| KR | 10-2010-0010251 A | | 2/2010 |

OTHER PUBLICATIONS

Korean Office action dated Feb. 3, 2012 issued to Korean priority patent application No. 10-2010-0021010, 4 pages.
KIPO Office action dated Jun. 22, 2012 for Korean application No. 10-2010-0021010 (5 pages).

* cited by examiner

*Primary Examiner* — Dah-Wei D Yuan
*Assistant Examiner* — Stephen Kitt
(74) *Attorney, Agent, or Firm* — Christie, Parker & Hale, LLP (57) ABSTRACT

A mask frame assembly for thin film deposition, the mask frame assembly including a frame having an opening; a plurality of masks having deposition patterns, the masks being fixed to the frame such that the deposition patterns extend over the opening; and a balance stick being fixed to the frame such that the balance stick is between two of the plurality of masks, the balance stick made from an elastically tensile material.

5 Claims, 11 Drawing Sheets

MASK FRAME ASSEMBLY FOR THIN FILM DEPOSITION AND METHOD OF ASSEMBLING THE SAME

CROSS-REFERENCE TO RELATED APPLICATION

This application claims priority to Korean Patent Application No. 10-2010-0021010, filed on Mar. 9, 2010, in the Korean Intellectual Property Office, the entire disclosure of which is incorporated herein by reference.

BACKGROUND

1. Field

The present invention relates to a mask frame assembly for thin film deposition.

2. Description of Related Art

Generally, organic light emitting display devices have superior characteristics such as wide viewing angles, high contrast ratios, and short response times.

Organic light-emitting display devices generally have a stacked structure including an anode, a cathode, and an emission layer located between the anode and the cathode. The devices display color images when holes and electrons, injected respectively from the anode and the cathode, recombine in the emission layer, which causes an emission of light. However, it may be difficult to achieve high light-emission efficiency with such a structure, and thus intermediate layers, including an electron injection layer, an electron transport layer, a hole transport layer, a hole injection layer, etc., are optionally located between the emission layer and each of the electrodes.

The electrodes and the interlayers may be formed using a variety of methods, such as a deposition method. When an organic light-emitting display device is manufactured using the deposition method, a fine metal mask (FMM) having the same pattern as a thin film to be formed contacts a substrate, and a thin film material is deposited over the FMM to form a thin film having the desired pattern.

As the size of the FMM increases, the possibility of an etching error occurring when the pattern is formed increases, and often, a middle portion of the FMM sags due to its weight. Thus, a divided mask formed by dividing a mask into several elongate or stripe-shaped portions and attaching them to a frame is often used. Although sagging of the divided mask occurs relatively infrequently compared to an undivided large-sized mask, sagging may still occur in the divided mask. Thus, to attach the divided mask to the frame, the divided mask is welded to the frame such that it is elastically extended in a lengthwise direction.

However, when the divided mask is welded to the frame while being extended in the manner described above, the frame may be deformed due to an elastic biasing force from the divided mask. When the frame is deformed, precision of mask patterns is degraded. Thus, in order to prevent deformation of the frame, a counter force is exerted on the frame when the divided mask is welded to the frame. In detail, the counter force is applied to the frame in a direction opposite to a direction in which the divided mask is elastically extended, so that when the extended divided mask is welded to the frame, even though the elastic restoring force of the divided mask is applied to the frame after welding has finished, the frame is not deformed. For example, when nine divided masks are attached to the frame, a counter force applied to the frame when a first divided mask is attached to the frame is largest, and the counter force to be applied gradually decreases as the number of divided masks is increased. Because the divided masks are welded to the frame while the counter force is continuously applied to the frame, as described above, deformation of the frame is suppressed even when the counter force is gradually decreased as the number of divided masks is increased. Thus, in an ideal case, after the last mask portion is welded to the frame, it may not be necessary to apply a counter force. Accordingly, after the last divided mask is welded to the frame, i.e., after a welding operation to weld the divided mask to the frame is completed, the frame is not be deformed because no biasing force or counter force is applied to the frame.

Because there is a small difference in tensile force due to a difference in characteristics of manufacturing each of the divided masks, even though the welding of the divided mask and the frame is performed in such a way that the counter force becomes zero in theory after the welding operation is completed, in reality, this is not the case. In other words, the counter force applied to the frame when each of the division frames is welded to the frame is calculated using a beam deflection theory, or the like. This means that the probability of accurately calculating the counter force when all of the divided masks have the same tensile characteristics is high, but in reality, characteristics of the divided masks are different from one another and thus the probability of accurately calculating the counter force is not perfect.

As such, the counter force may not become zero after the welding operation is completed and thus, the frame may be deformed. As a result, the precise patterns that should be formed by a deposition process may be distorted.

SUMMARY

The present invention provides a mask frame assembly for thin film deposition, having an improved structure in which deformation of a frame can be stably prevented after assembling of a mask and the frame is completed, and a method of assembling the same.

According to an aspect of the present invention, there is provided a mask frame assembly for thin film deposition, the mask frame assembly including a frame having an opening; a plurality of masks having deposition patterns, the masks being fixed to the frame such that the deposition patterns extend over the opening; and a balance stick being fixed to the frame such that the balance stick is between two of the plurality of masks, the balance stick made from an elastically tensile material.

In one embodiment, the plurality of masks are elongate and extend from a first side to a second side of the frame. Further, a thickness of the balance stick may be greater than a thickness of each of the masks and the frame may have a groove accommodating the balance stick. In one embodiment, a depth of the groove is substantially equal to the thickness of the balance stick.

A shielding mask may be attached to the balance stick to shield a gap between the balance stick and the masks.

In another embodiment, a method of assembling a mask frame assembly for thin film deposition is provided, the mask frame assembly including a frame having an opening, a plurality of masks having deposition patterns, and a balance stick made from an elastically tensile material. The method includes sequentially fixing each of the masks to the frame such that the deposition patterns of the one of the masks extend over the opening; and fixing the balance stick to the frame between adjacent ones of the masks.

In one embodiment, the sequential fixing of the plurality of masks to the frame includes for each mask elastically extending the mask in a first direction; applying a counter force to the frame in a second direction substantially opposite to the first direction; and welding end portions of the mask to the frame. Further, in one embodiment, the fixing of the balance stick to the frame includes elastically extending the balance stick in a first direction; applying a counter force to the frame in a section direction substantially opposite to the first direction; and welding end portions of the balance stick to the frame. In one embodiment, the counter force applied for each subsequent mask decreases until the counter force is substantially zero.

BRIEF DESCRIPTION OF THE DRAWINGS

The above and other features and advantages of the present invention will become more apparent by a description in detail of exemplary embodiments thereof with reference to the attached drawings in which.

DETAILED DESCRIPTION

Embodiments of the present invention will now be described more fully with reference to the accompanying drawings.

Figure 1:
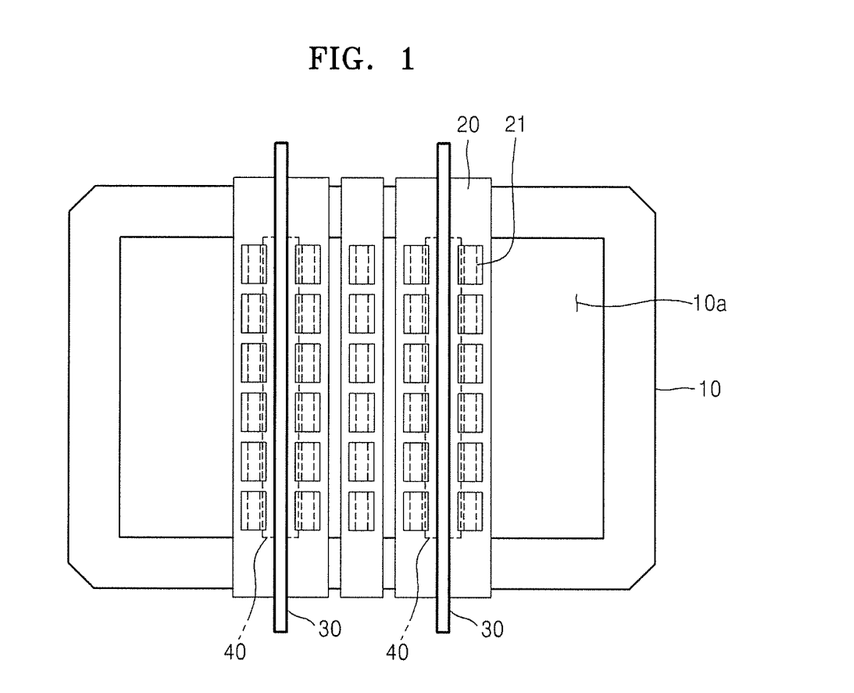
FIG. 1 is a plan view of a mask frame assembly for thin film deposition, according to an embodiment of the present invention.

FIG. 1 is a plan view of a mask frame assembly for thin film deposition, according to an embodiment of the present invention. Referring to FIG. 1, the mask frame assembly includes a frame 10 having an opening 10a, a plurality of masks 20 having end portions fixed to the frame 10, and a balance stick 30. In FIG. 1, for convenience of explanation, only five masks 20 are shown so as to show the opening 10a. However, in one embodiment, after assembling of the masks 20 is completed, the opening 10a is fully covered by the masks 20 (see FIG. 4H).

The frame 10 forms an outer frame of the mask frame assembly and has a substantially rectangular shape in which the opening 10a is formed in the middle of the frame 10. The end portions of the masks 20 and end portions of the balance stick 30 are fixed to a pair of opposite sides of the frame 10 by a welding process.

The masks 20 are elongate (i.e., they are shaped as long-stripes) and include deposition patterns 21 formed over the opening 10a, and the end portions of the masks 20 are welded to the frame 10, as described above. In one embodiment, the masks 20 are not formed as a single member for covering all of the opening 10a, but rather are divided into a plurality of elongate stripe-shaped portions and attached to the frame 10 to prevent or reduce the likelihood of an etching error and sagging due to the weight of the masks 20, as described above. The masks 20 may be formed of nickel (Ni), a nickel alloy, a nickel-cobalt alloy, or the like.

Figure 2:
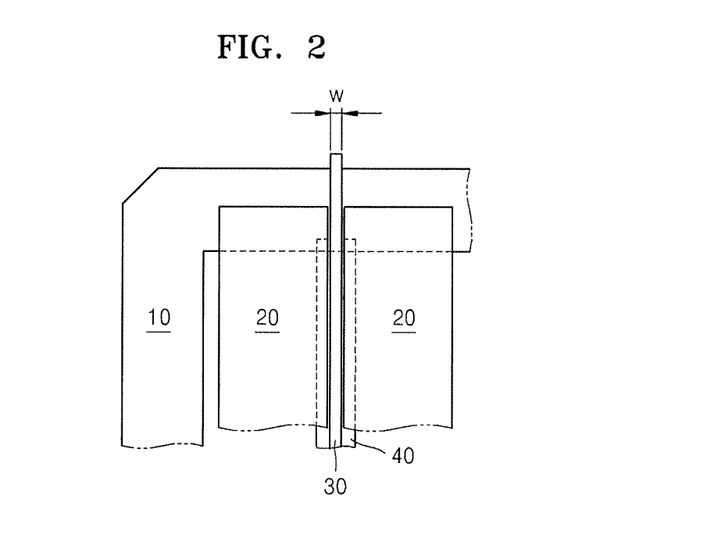
FIG. 2 is an enlarged view of a portion of the mask frame assembly of FIG. 1.
Figure 3:
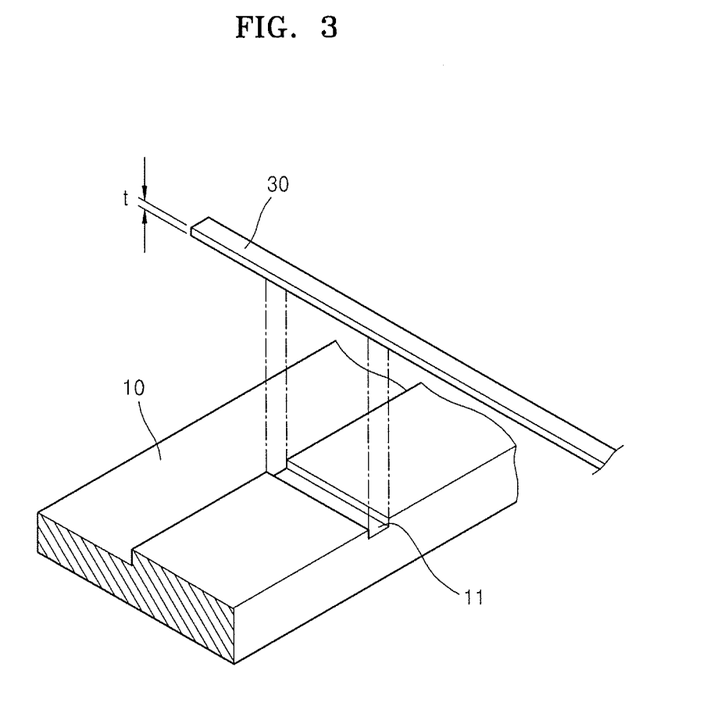
FIG. 3 is a view showing a balance stick combined with the mask frame assembly of FIG. 1.

The balance stick 30 is located between the masks 20 to be adjacent to and parallel to the masks 20, and the end portions thereof are fixed to the frame 10 by using a welding process, like with the masks 20, as illustrated in FIG. 1. The balance stick 30 is primarily for prevention of deformation of the frame 10 after the assembling of the masks 20 is completed. The balance stick 30 may be an elastically tensile member and may be formed of the same material as the masks 20, for example. Since the balance stick 30 is to be located between the masks 20 to fill in a space between the masks 20, a width w of the balance stick 30 is significantly less than a width of the mask 20, as illustrated in FIG. 2. However, a thickness t (see FIG. 3) of the balance stick 30 is greater than a thickness of the mask 20. In order for the balance stick 30 to adjust a counter force to be substantially zero after the assembling of the masks 20 is completed, the balance stick 30 should be sufficiently elastically tensile. Thus, the thickness of the masks 20 is generally between about 30 to about 50 μm, whereas the thickness t of the balance stick 30 is between about 100 to about 1000 μm. An operation of adjusting the counter force to be zero by using the balance stick 30 of the assembling procedure as described above will be described below. Since the thickness t of the balance stick 30 is greater than a thickness of the masks 20, when both the masks 20 and the balance stick 30 are attached to the frame 10, the balance stick 30 protrudes from the frame 10 more than the masks 20 protrude from the frame 10. Thus, in order to prevent protruding of the balance stick 30, a groove 11 for accommodating the balance stick 30 is formed in the frame 10, and the end portions of the balance stick 30 are inserted in the groove 11 so that the balance stick 30 does not protrude from the frame 10 more than the masks 20 protrude from the frame 10, as illustrated in FIG. 3. In other words, an external surface of the balance stick 30 is substantially flush within an external surface of the masks 20 when the balance stick 30 and the masks 20 are attached to the frame 10. A depth of the groove 11 is substantially equal to a difference between the thickness t of the balance stick 30 and the thickness of the masks 20.

A reference numeral 40 denotes a shielding mask for shielding a gap between the balance stick 30 and the masks 20. The shielding mask 40 is attached to the balance stick 30 and is installed onto the frame 10.

Hereinafter, the operation of adjusting the counter force to be zero by using the balance stick 30 when the masks 20 and the balance stick 30 are assembled on the frame 10 will be described with reference to FIGS. 4A through 4H and FIG. 5.

Figure 4A:
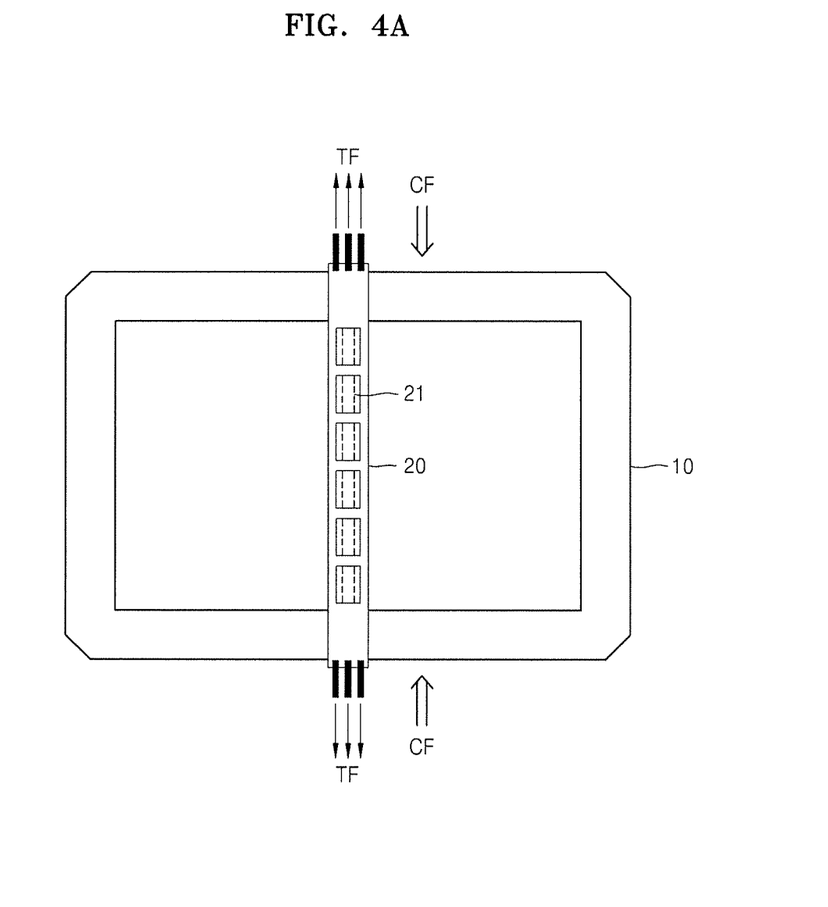
FIGS. 4A through 4H are schematic plan views showing a method of assembling the mask frame assembly of FIG. 1, according to an embodiment of the present invention.
Figure 4B:
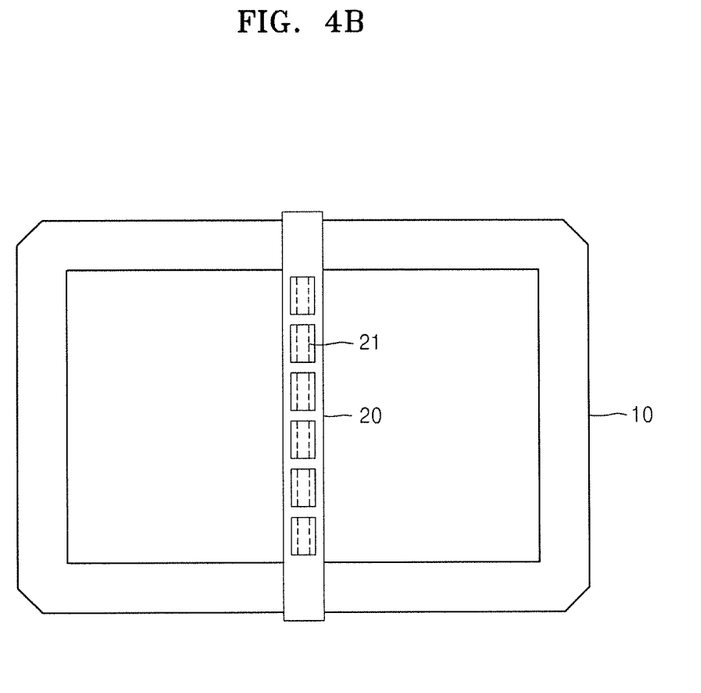

Referring to FIGS. 4A and 4B, a first mask 20 is welded to the frame 10. In detail, referring to FIG. 4A, a tensile force TF is exerted on the first mask 20, and a counter force CF in a direction substantially opposite to a direction in which the tensile force TF is exerted on the first mask 20 is applied to the frame 10. Referring to FIG. 4B, in such a state, the end portions of the first mask 20 are welded to the frame 10 and are attached thereto. Applying of the tensile force TF to the first mask 20 is to substantially prevent sagging of the first mask 20, and applying of the counter force CF to the frame 10 is to substantially prevent deformation of the frame 10 due to the elastic restoring force of the first mask 20.

Figure 4C:
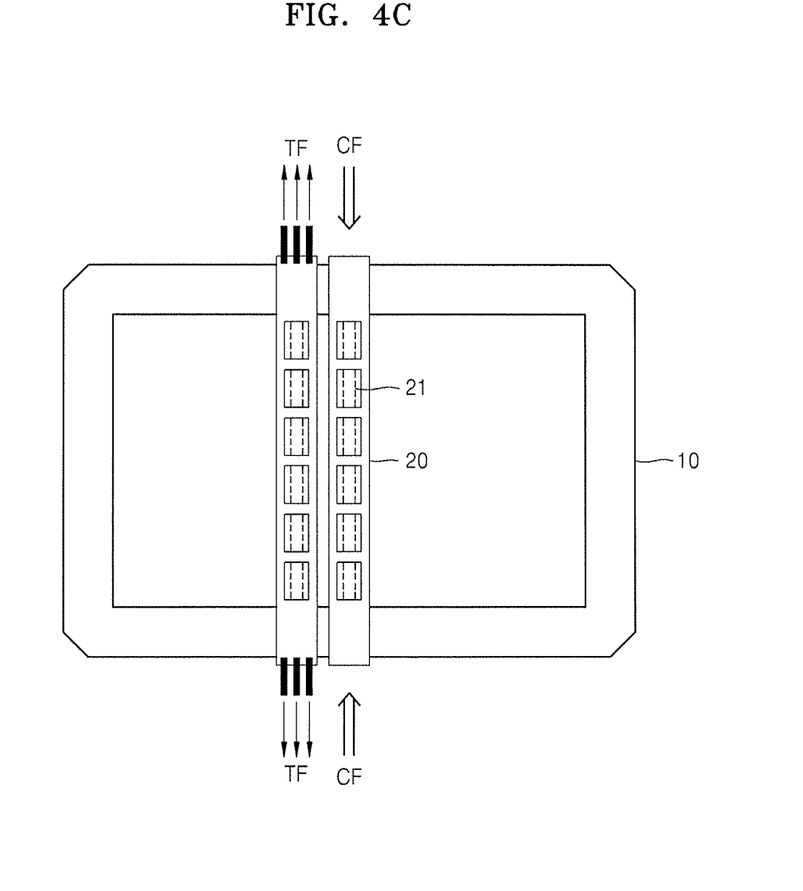
Figure 4D:
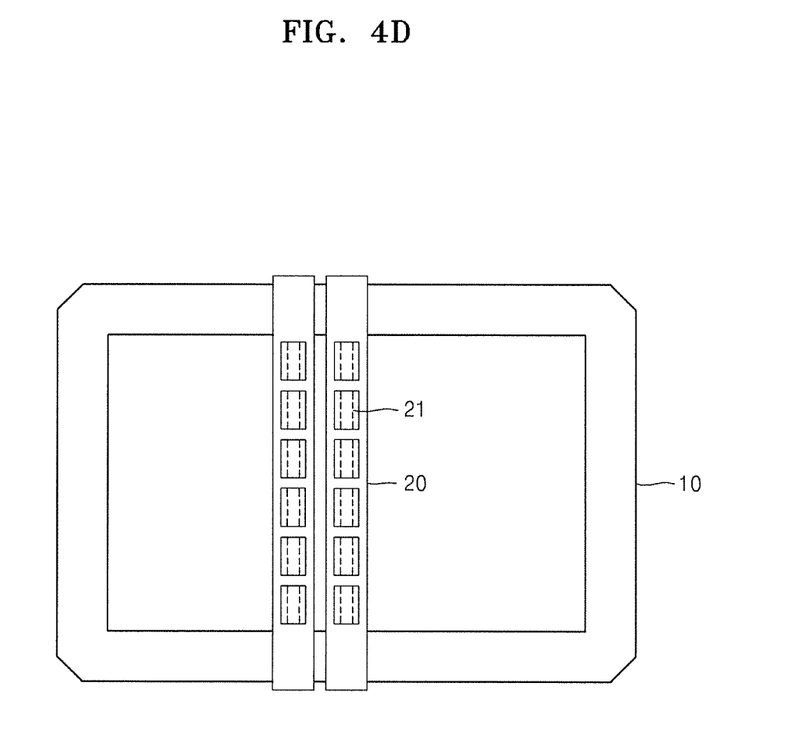

Referring to FIG. 4C, the tensile force TF and the counter force CF are applied to a second mask 20 and the frame 10, respectively, in the same manner as with the first mask 20. Referring to FIG. 4D, the end portions of the second mask 20 are welded to the frame 10 so that the second mask 20 is fixed to the frame 10. The counter force CF decreases compared to the counterforce used when the first mask 20 is attached to the frame 10. Since the frame 10 has been pressurized by applying the counter force CF to the frame 10 as described above, lesser deformation of the frame 10 is likely to occur and thus a smaller counter force CF may be applied to the frame 10 subsequently. Thus, as the number of masks 20 attached to the frame 10 increases, the counter force CF applied to the frame 10 gradually decreases.

Figure 4E:
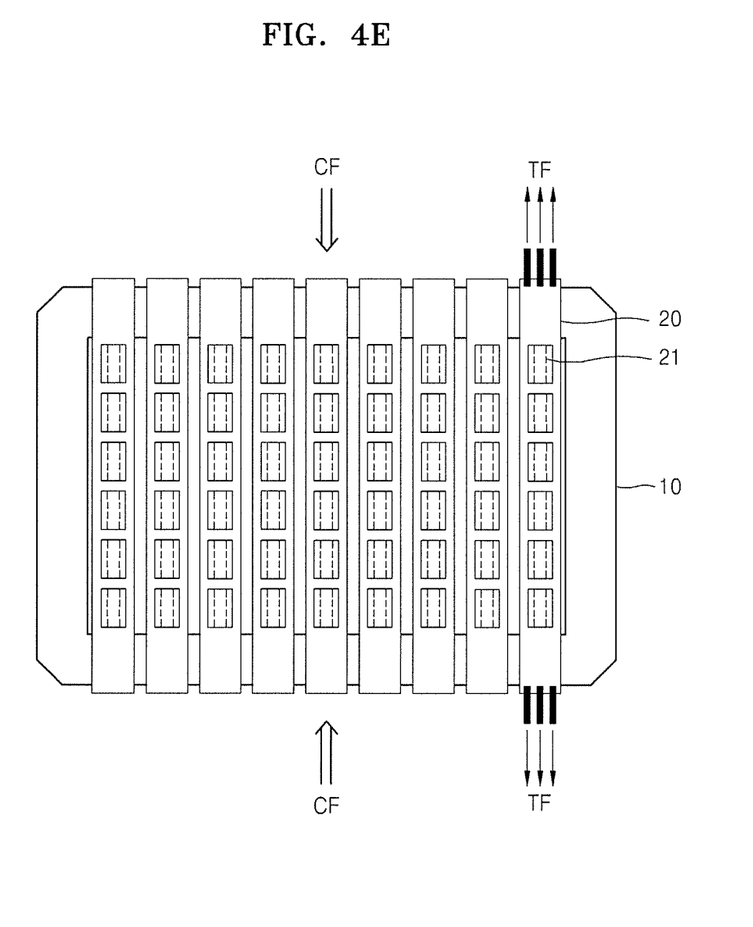
Figure 4F:
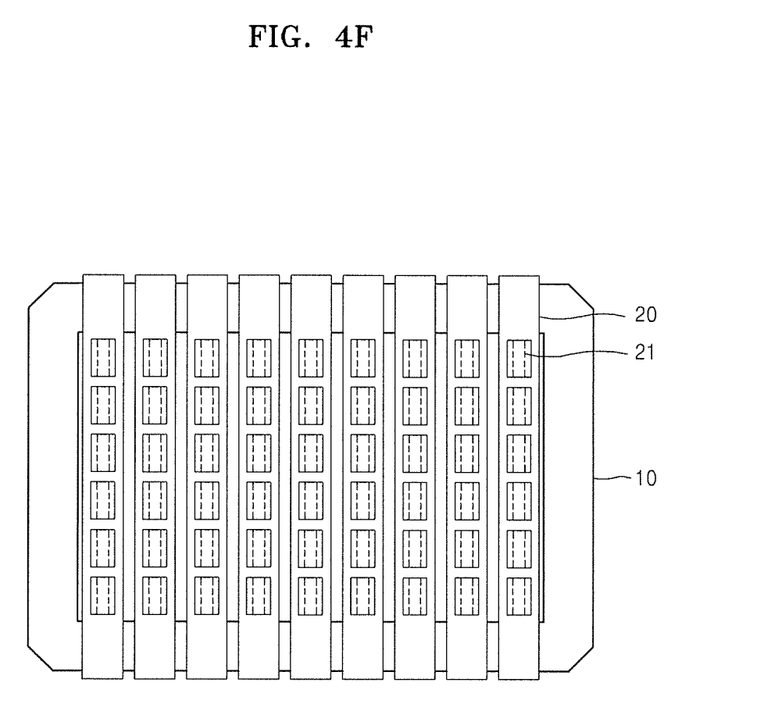

The masks 20 are sequentially attached to the frame 10 in this manner until a last mask 20 is welded thereto, as illustrated in FIGS. 4E and 4F.

In this regard, after the last mask 20 is fixed to the frame 10, the tensile force TF and the counter force CF in the previous stages are set in such a way that the counter force CF may be greater than zero. In detail, if one more mask 20 is attached to the frame 10 after the last mask 20 is fixed thereto, the counter force CF may be set to 0. In other words, the tensile force TF and the counter force CF are first calculated to be such that the counter force CF may not be zero but may be greater than zero after the last mask 20 is attached to the frame.

Because there are differences in tensile characteristics between the masks 20, it is not easy to adjust the counter force CF to be zero as calculated, after the assembling of the masks 20 is completed and the deposition patterns 21 are formed in the masks 20. Thus, in consideration of deformation of the deposition patterns 21, the masks 20 have a relatively narrow elastic tensile range and thus a range in which the counter force CF may be adjusted is also narrow. Thus, when the assembling of the masks 20 is completed, the counter force CF is set to be greater than zero, and the remaining portions of the counter force CF are adjusted by using the balance stick 30 having a wide elastic tensile range. Since the deposition patterns 21 are not formed on the balance stick 30, even when the tensile force TF is applied to the balance stick 30, the tensile force TF does not negatively affect the balance stick 30.

Figure 5:
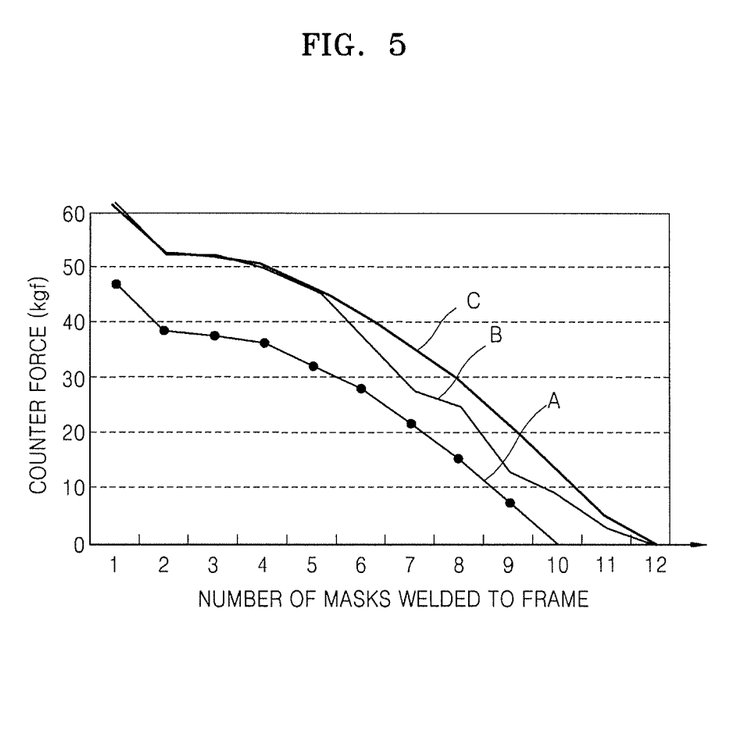
FIG. 5 is a graph showing a counter force applied to a frame according to the number of welding masks welded to the frame when the mask frame assembly of FIG. 1 is assembled.

This situation will be described with reference to FIG. 5. FIG. 5 is a graph showing the counter force CF applied to the frame 10 according to the number of masks 20 welded to the frame 10 when the mask frame assembly of FIG. 1 is assembled. Plot A represents setting values of the counter force CF applied to the frame 10 while the masks 20 are welded to the frame 10 when the mask frame assembly of FIG. 1 does not include the balance stick 30. The setting values show that, when nine masks 20 are installed, the counter force CF is not zero after the last (ninth) mask 20 is attached to the frame 10. The setting values are appropriate to a case where the nine masks 20 have the same tensile characteristics. A tenth mask 20 on the horizontal axis means that the tenth mask 20 is not actually installed but if one more mask 20 is installed after assembling of the ninth mask 20 is completed, the counter force CF is zero. However, in actuality, since there are differences in tensile characteristics of the masks 20, there is no case where the setting values are given as described above.

Thus, after the ninth mask 20 is welded to the frame 10, the counter force CF is set to be greater than zero, and the remaining portion of the counter force CF is adjusted by using the balance stick 30. A plot C represents setting values of the counter force CF in consideration of a case where two balance sticks 30 are installed. As shown in Graph C, even after all of nine masks 20 are welded to the frame 10, the counter force CF is set greater than zero. However, after two balance sticks 30 are installed, the counter force CF is set to be zero. The setting values are obtained only from calculation and are based on a case where tensile characteristics of all of the masks 20 are the same.

Thus, the counter force CF actually applied to an assembling process is varied, and a plot B represents setting values of the counter force CF actually applied to the assembling process. The example of graph B corresponds to a case where the counter force CF is different from calculated setting values (see graph C) starting from when a sixth mask 20 is assembled. In detail, the tensile characteristic of the sixth mask 20 is different from expected and thus, there is a difference in the tensile force TF between the masks 20, and there is a variation even in the counter force CF to be applied to the frame 10 due to the difference in the tensile force TF between the masks 20. If there is no balance stick 30, the tensile force TF of the remaining masks 20 can be adjusted so that the counter force CT is zero. As described above, since the deposition patterns 21 are formed in the masks 20, a range in which the tensile force TF may be adjusted is narrow. Thus, the counter force CF may not be set to zero, and the frame 10 may be deformed after assembling. However, in the present embodiment, the counter force CF is set in consideration of further adjustment of the tensile force TF by using the balance stick 30. Thus, even when there is a little difference between current setting values of the counter force CF and first-calculated setting values of the counter force CF after assembling of the masks 20 is completed, the counter force CF is set to be greater than zero. In this state, the remaining counter force CF is adjusted to be zero by using the balance stick 30. Since the deposition patterns 21 are not formed on the balance stick 30, even when the tensile force TF is applied to the balance stick 30, the tensile force TF does not affect the balance stick 30. In detail, a range in which the tensile force TF may be applied to the balance stick 30 is much wider than that with respect to the masks 20. Thus, the balance stick 30 is attached to the frame 10 while elastically extending the balance stick 30. In this case, the tensile force TF and the counter force CF are adjusted so that the counter force CF applied to the frame 10 can be zero after the last mask 20 is assembled.

Figure 4G:
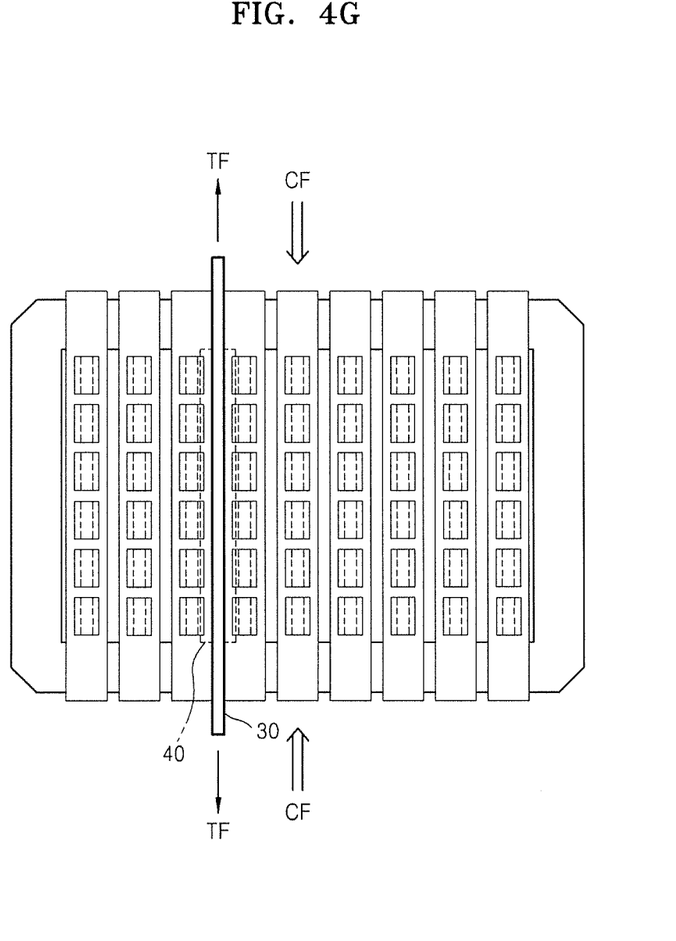
Figure 4H:
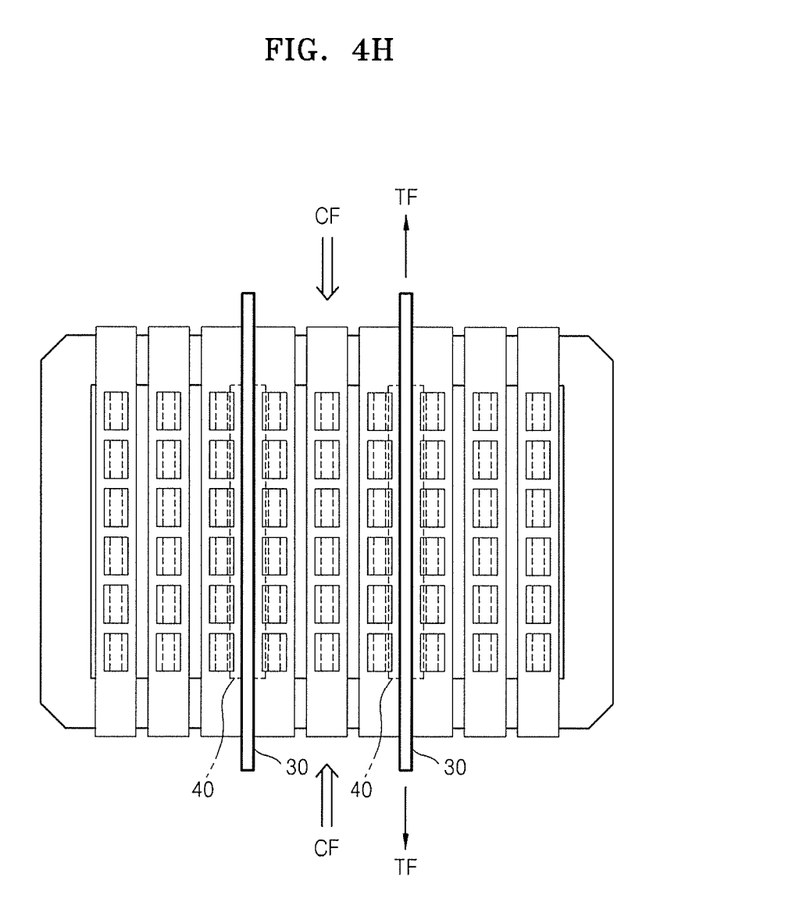

FIG. 4G illustrates an operation of installing a first balance stick 30 between the masks 20, and FIG. 4H illustrates an operation of installing a second balance stick 30 between the masks 20. The number of balance sticks 30 may be varied if necessary. For example, when the number of masks 20 is an odd number, two or four (even-numbered) balance sticks 30 may be installed to be symmetrical to each of the masks 20, and when the number of masks 20 is an even number, one balance stick 30 may be installed between adjacent masks 20, and an even number of balance sticks 30 may be installed on opposite sides of the center balance stick 30. In one embodiment, only a single balance stick 30 may be installed. In any case, the number of balance sticks 30 is adjusted while the balance sticks 30 are welded to be such that the remaining counter force CF that is greater than zero may become zero after the assembling of the masks 20 is completed.

By using the above structure, the counter force CF may be adjusted by using the balance stick 30 having a wide elastic tensile range after the masks 20 are welded to the frame 10, to substantially prevent or reduce the likelihood of deformation of the frame 10. Thus, a more stable or solid mask frame assembly can be provided.

The mask frame assembly for thin film deposition may be used for thin film deposition including a patterning process of an organic emission layer.

Features of the present invention will be summarized as below. First, since the masks 20 may have a distribution of tensile characteristics, unbalance between the counter force CF calculated using a set tensile force and applied to the frame 10 and the tensile force TF applied to the masks 20 may occur. Thus, the counter force CF is not easily adjusted to be zero, as calculated, after assembly of the masks 20 is completed. If so, the frame 10 and the masks 20 are deformed and thus precision of patterns may be degraded. In this regard, by installing the balance stick 30, unbalance between the counter force CF applied to the frame 10 and the tensile force TF applied to the masks 20 can be compensated for. Thus, precision of patterns can be improved.

As described above, in the mask frame assembly for thin film deposition and the method of assembling the same according to the present invention, deformation of a frame is sufficiently suppressed after assembling of masks and the frame is completed so that a more stable and precise patterning process can be performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A mask frame assembly for thin film deposition, the mask frame assembly comprising:
a frame having an opening and a plurality of grooves;
a plurality of masks having deposition patterns, the masks being spaced from each other and fixed to the frame such that the deposition patterns extend over the opening, wherein a longitudinal axis of each of the masks extends in a first direction; and
a balance stick being fixed to one of the grooves on the frame, wherein the balance stick is between two of the plurality of masks such that a longitudinal axis of the balance stick is substantially parallel to the longitudinal axis of each of the masks, the balance stick comprising an elastic material, wherein a thickness of the balance stick is greater than a thickness of each of the masks and wherein an outwardly-facing surface of each balance stick is substantially flush with an outwardly-facing surface of each of the masks.

2. The mask frame assembly of claim 1, wherein the plurality of masks are elongate and extend from a first side to a second side of the frame.

3. The mask frame assembly of claim 1, wherein a depth of the groove is substantially equal to a difference between the thickness of the balance stick and the thickness of each of the masks.

4. The mask frame assembly of claim 1, wherein a width of the balance stick is smaller than a width of each of the masks.

5. The mask frame assembly of claim 1, wherein a shielding mask is attached to the balance stick and shields a gap between the balance stick and the masks.

* * * * *